United States Patent [19]

Takano

[11] Patent Number: 4,714,957

[45] Date of Patent: Dec. 22, 1987

[54] APPARATUS AND METHOD FOR MAKING A STAMP

[75] Inventor: Hiroji Takano, Yawata, Japan

[73] Assignee: Matsushita Electric Industrial Co., Ltd., Kadoma, Japan

[21] Appl. No.: 901,786

[22] Filed: Aug. 29, 1986

[30] Foreign Application Priority Data

Sep. 2, 1985 [JP] Japan .................................. 60-193510

[51] Int. Cl.⁴ ...................... H04N 1/032; H04N 1/387
[52] U.S. Cl. ........................................ 358/93; 358/96; 358/297; 358/903
[58] Field of Search .................... 358/75, 80, 296, 297, 358/299, 286, 293, 302, 903, 96

[56] References Cited

U.S. PATENT DOCUMENTS

4,393,411 7/1983 Amtower ............................ 358/286
4,481,528 11/1984 Peck ..................................... 358/75

Primary Examiner—Michael A. Masinick
Attorney, Agent, or Firm—Cushman, Darby & Cushman

[57] ABSTRACT

A picture of a person is photographed by an electronic camera such as TV camera, and output image data signal thereof is differential-operated, so that a line pattern picture signal is produced; then by making a light image of the line pattern picture on a TV set, a photosensitive resin layer is exposed, and by developing it a stamp of the line pattern picture is produced.

8 Claims, 15 Drawing Figures

MAY

APPARATUS AND METHOD FOR MAKING A STAMP

FIELD OF THE INVENTION AND RELATED ART STATEMENT

1. Field of the Invention

The present invention relates generally to method for easy and speedy making of stamp of any desired line pattern, such as line pattern of a face of a person combined with letter or character of his name.

2. Description of the Related Art

The present age is called in a way as the "self-identify-minded era", which is symbolized by such a vogue as having one's image printed on his or her visiting-card or as having a salesman's picture illustrated in his or her sales literatures. In the above-mentioned cases it would be very convenient if our images could be handily rubber-stamped or could be ordered for printing as easily as the conventional characters-only visiting-cards. For such needs as above, the relief printing technology has so far been utilized. This method is widely employed in the newsprinting, wherein types bearing various sizes of dots (for impressing dark or light images, respectively) are prepared and used together with character print types.

Figure 10:
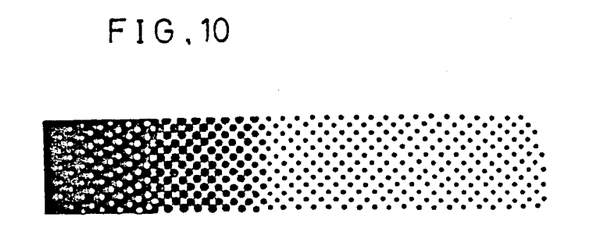
FIG. 10 is the example of gradation represented by the conventional relief printing system.

FIG. 10 shows, in an enlarged scale, an example of the relief-printed pattern, wherein gradation is represented by sizes of black dots, and the left end part is darkest and the right end part is brightest in the gradation.

However, when a stamp, for instance, a rubber stamp is made in accordance with the above-mentioned relief-printed pattern, it is difficult to clearly print a stamp because very small dots are provided in rather high density and engraving between the dots is not so deep, and therefore stamp ink is likely to be filled in the engraved gaps between dots, thereby distorting the gradation of the relief made stamp. And especially the pattern for the medium gradation part is poorly distorted. Furthermore, such shallow and very small gaps between the dots are also easily filled with dust. Still furthermore, the relief made rubber stamp has a shortcoming that its small sized dots for the parts representing rather white or bright parts of the pattern is mechanically weak and is liable to be destroyed, and therefore their pattern is damaged soon.

In addition to the above, when the above-mentioned relief printing is utilized when a small portrait picture is intended to be printed on a name card, because of limitation of density of the small dots in the relief printing, the expression of the picture becomes poor. Therefore, for such small image, a line painting like a cartoon picture is better, and sometimes such line pattern picture of face is utilized for the name cards.

Figure 11:
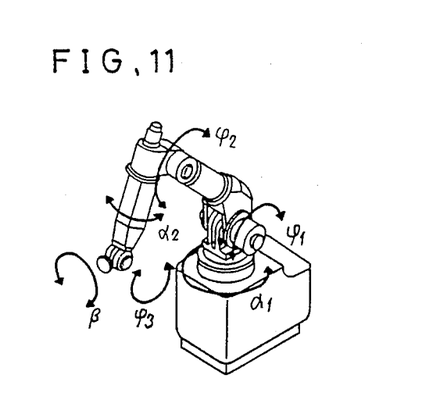
FIG. 11 is the example of technical illustration wherein the industrial robot is drawn by a drawing by lines by a draftman.

FIG. 11 shows one example of technical illustration wherein an industrial robot machine is drawn. Though such illustration can clearly illustrate detailed configuration of machine, automobile, etc. and are used widely in manual or catalogs, such illustration requires a high skill of professionals, and productivity thereof is not good.

OBJECT AND SUMMARY OF THE INVENTION

The present invention purports to dissolve the above-mentioned problem, and to afford a novel way and apparatus for making steps of line pattern portrait or any other items, such as appliances or machines, in an automatic way and in a short time.

Method for making a stamp in accordance with the present invention comprises:
step for producing image data signal from an object,
step of processing the image data signal to produce a signal of line pattern of edges of the object,
step of producing an optical image of photoactive rays from the signal of line pattern,
step of irradiating a photosensitive resin layer formed on a substrate with the photoactive rays of the optical image, and
step of developing a latent image made by the irradiation on the photosensitive resin layer to produce a stamp of the line pattern.

Further, the method for making a stamp in accordance with the present invention comprises:
step of producing image data signal from an object,
step of processing the image data signal to produce a signal of line pattern of edges of the object,
step of producing an optical image of photoactive rays from the signal of line pattern,
step of irradiating a photosensitive film with the photoactive rays of the optical image,
step of developing a latent image made by the irradiation on the photosensitive film to produce a mask pattern,
step of irradiating a photosensitive resin layer formed on a substrate with a photoactive light through the mask pattern, and
step of developing a latent image made by the irradiation on the photosensitive resin layer, to produce a stamp of the line pattern.

Further, the apparatus for making a stamp in accordance with the present invention comprises:
means for producing image data signal from an object,
means for processing the image data signal to produce a signal of line pattern of edges of the object,
means for producing an optical image of photoactive rays from the signal of line pattern to produce an image of line pattern, and
means for irradiating a photosensitive resin layer formed on a substrate with the photosensitive rays of the optical image.

According to the methods and apparatus of the present invention, a picture of clear line pattern which is suitable for printing on a small space of a name card or the like is easily obtainable in a very short time without any skill.

DESCRIPTION OF THE PREFERRED EMBODIMENTS

A preferred embodiment of the present invention is described with reference to FIG. 1 through FIG. 9.

Figure 1:
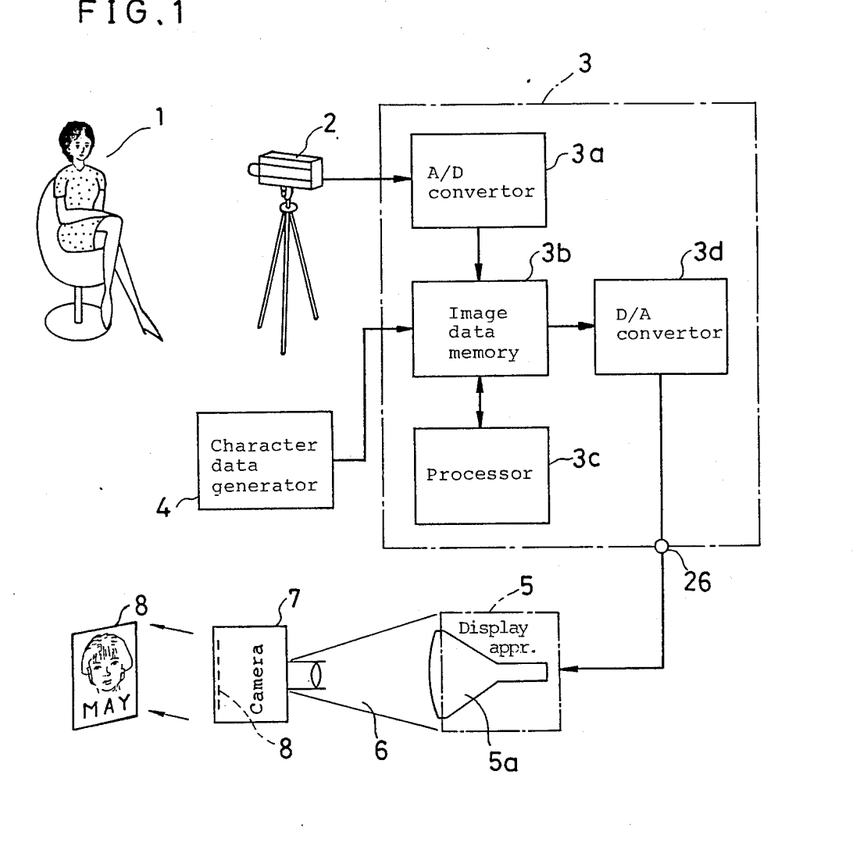
FIG. 1 is a block diagram showing a constitution of a first embodiment in accordance with the present invention.
Figure 4A:
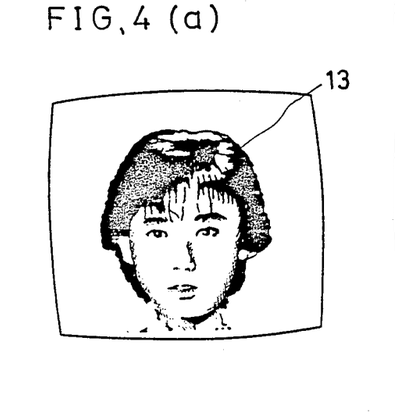
FIG. 4(a) is a schematical illustration of an original picture with gradation obtained by a television camera.

FIG. 1 shows fundamental constitution of a first embodiment of the apparatus and method of the present invention. An electronics camera, for instance, a television camera 2 picks up the objective scenery 1 and produces a monochrome image data signal, which is given to an image data processing circuit 3. The image data signal issued from the camera 4 has a gradation as shown in FIG. 4(a), and this is defined as an original data. The image data processing circuit 3 is for processing the image data corresponding to the image of FIG. 4(a) to produce a line pattern as shown in FIG. 4(b).

Figure 6:
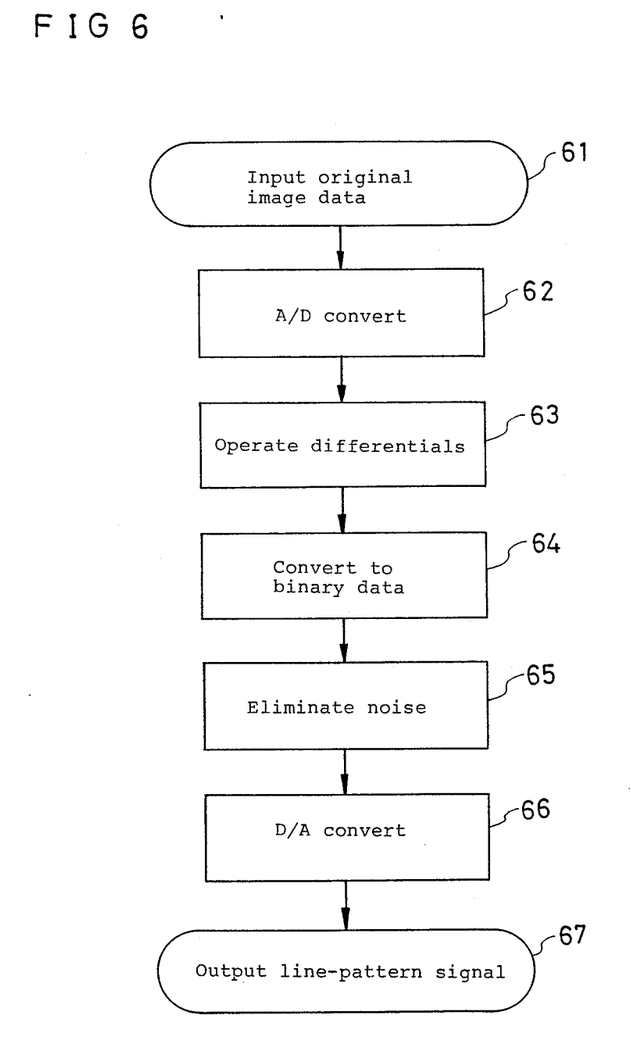
FIG. 6 is a flow chart showing an image data processing used in the present invention.

A flow chart of FIG. 6 shows principal steps of processing the image data having the gradation into an image data of line pattern. As shown in FIG. 6, at first one field of the original image data is inputted by dividing the field into 65,536 pixels by dividing the image into 256 horizontal lines and 256 vertical rows (65,536 pixels=256 lines×256 rows). Then, gradation or brightness data of respective pixels are A/D converted by an A/D converter 3a, wherein the brightness data is converted into 8 bit digital data and stored in a image data memory 3b.

Figure 4B:
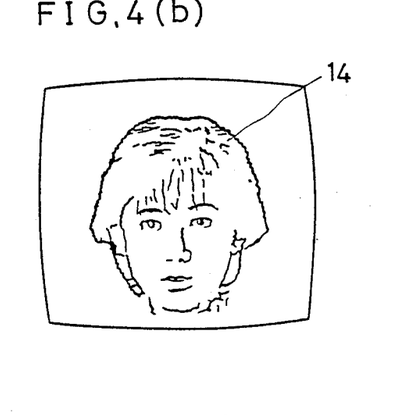
FIG. 4(b) is a line pattern resulted from an image data processing used in the present invention.

The line pattern 14 as shown in FIG. 4(b) is a pattern consisting of line which features the image with gradation 13 of FIG. 4(a). Extracting of such line pattern from the image with gradation can be made by operating differentials of brightness information of the original image. This is because that clear edge parts of the image is the parts where the brightness abruptly changes, whereas in the parts other than the edge parts the brightness or gradation change only little or there is no change there. Accordingly, the operation of differential corresponds extraction of the brightness change, and resultantly it detects the edge of the object figure.

Hereafter, differential operation of the image data is elucidated taking a simplified example and one embodiment of the invention.

Figure 5A:
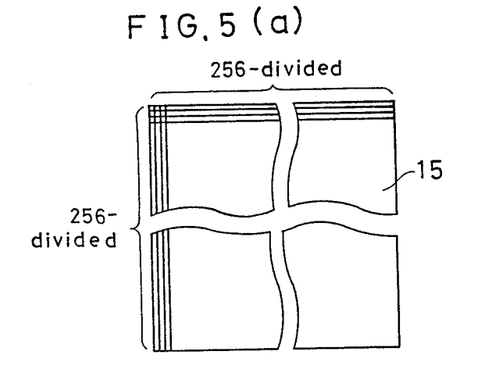
FIG. 5(a) is a schematical illustration of a pixel dividing of a picture.
Figure 5B:
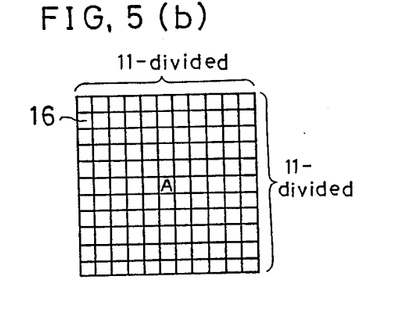
FIG. 5(b) is a schematical illustration of a differential mask.
Figure 5C:
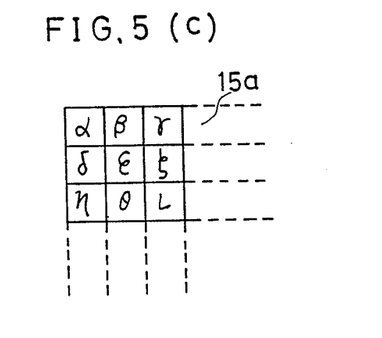
FIG. 5(c) and FIG. 5(d) are schematical illustrations of a simplified pixel-dividing and differential mask, respectively.
Figure 5D:
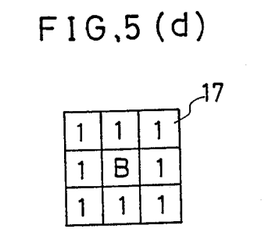

FIG. 5(d) shows a simplified differential operation mask which consists of 9 pixel size, the respective mask elements having weight such that the center element is weighted −8 and other 8 elements are weighted respectively +1.

Image data of one picture is stored in the image data memory 3b, and by reading out the brightness data of respective pixels, the brightness data are multiplied with the above-mentioned respective weighting numbers, thereby producing resultant products for respective pixels. Then, the products thus obtained are summed up, and the sum of the products for 9 pixels gives a differential value for the center point of the 9 pixels covered by the operation mask.

FIG. 5(c) shows leftest and top corner part of the picture of FIG. 5(a) in an enlarged scale; and in the above-mentioned case, a first time differential operation is carried out by superposing a differential operation mask 17 of FIG. 5(d) on the 9 pixels $\alpha, \beta, \gamma, \ldots \theta, \iota$ of FIG. 5(c). And the operation is carried out as follows:

$$D_\alpha \times 1 + D_\beta \times 1 + D_\gamma \times 1 +$$
$$D_\delta \times 1 + D_\epsilon \times (-8) + D_\zeta \times 1 +$$
$$D_\eta \times 1 + D_\theta \times 1 + D_\iota \times 1 = \text{ⅲ}_\epsilon,$$

wherein D with respective Greek letter suffixes represent densities or brightness of respective pixels $\alpha, \beta, \ldots$ The obtained $\text{ⅲ}_\epsilon$ represents differential value for the pixels $\epsilon$. In the second differential operation, the differential operation mask 17 of FIG. 5(d) is shifted rightward by one pixel and the same multiplications and summing is made to obtain a next differential value $D_\xi$. Further, next differential operation is made by further shifting the differential operation mask 17 rightward by one pixel pitch.

After completing the differential operation for all pixels of the second line, namely $\epsilon, \xi \ldots$, next differential operation is made by returning the differential operation mask 17 to the leftest end and downwardly shifting by one pixel pitch, and thereafter successively shifting rightward, thus producing the differential value for the pixels of the third line $\theta, \iota, \ldots$.

In the similar manner, the differential operation is made until the right bottom end of the differential operation mask 17 reaches the right bottom end of the pixels of the picture 15 of FIG. 5(a).

In the above-mentioned elucidation, for the simplicity, the differential operation mask 17 is shown as having 9 mask elements. But in the actual preferred embodiment, the differential operation mask comprises a size of 121 pixels having 11 lines and 11 rows, wherein its central mask element A has a weighting number of −120 and all other 120 mask elements has weighing number of +1.

The size of the differential operation mask can be selected arbitrarily and the size should be selected depending on the contents and purpose of the original picture. And the selection of the weighting number of the differential mask elements is also appropriately selectable, and it should be selected depending on the contents and purpose of the differential. For the purpose of obtaining a line pattern, like a cartoon picture made by pen, the differential operation mask of 11×11=121 pixel size is recommendable. The results of the above-mentioned differential operation is stored in the image data memory 3b, and by utilizing the stored image data, the following processing is carried out.

Results of the differential operation of respective pixels are read out in turn and are compared with a predetermined threshold value; and when the read out value is larger than the threshold value, a data of 1 is given to the memory 36, and when the read out value is smaller than the threshold value a data of 0 is given, thereby to make the data into binary values. By this binary processing, the respective pixel becomes either 0 (black) or 1 (white), and there are no half-tone data. At last, isolated small dots, which is not connected to other edge lines made by the above-mentioned line-patterning, is deleted by means of known noise elimination process, thereby making the image data as simple line pattern as possible.

The above-mentioned operations and data processings are carried out all by the computer circuit 3c, and the data handled in this apparatus are all of digital data, and the processings consists only of known multiplication and summing, and reading out of the memory can be easily made by ordinary microcomputer.

The above-mentioned result of the image data processing is stored in the image data memory 3b as digital information. The digital information is read out in an appropriate order in order to be reproduced by a display apparatus 5, such as a TV set, and the read out signal is converted to a TV signal in the above-mentioned example, by being given to a D/A converter 3d, and known synchronization signal for TV is attached thereto. Then, the composite TV signal is issued from the image data processing circuit 3 through its output terminal 26 to the display apparatus 5 having a CRT tube 5a. A camera 7 is provided in front of a phosphor screen of the cathode ray tube 5a, and an appropriate light masking cover 6 is provided to cover the phosphor screen and the lens part of the camera 7. Accordingly, the camera has a clear image on its film 8 therein.

Figure 2:
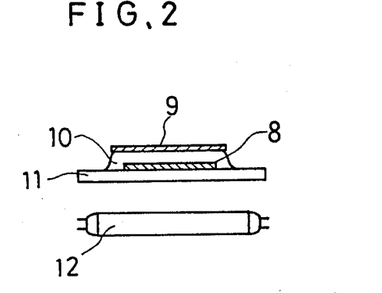
FIG. 2 is a schematical sectional view showing a configuration of irradiation of photosensitive resin layer through a mask film.
Figure 3:
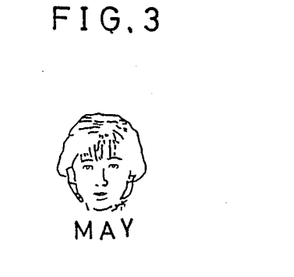
FIG. 3 is one example of stamped picture made by means of a stamp manufactured in accordance with the present invention.

Next, method of making a stamp by using the film which is exposed in the above-mentioned process is elucidated with reference to FIG. 2. The film 8, which has a line pattern of a picture such as shown in FIG. 3, is then put on a glass plate 11, and thereon a known photosensitive resin 10 of acryl resin, thiol resin or epoxy resin (for instance, APR ® (NS-50) prepared by Asahi Kasei Kogyo Kabushiki Kaisha) is stored and a rear seat 9 as substrate is placed thereon so as to make the photosensitive resin layer into uniform thickness.

A photoactive light source 12 emits photoactive rays, such as UV rays, through the film 8 to expose the photosensitive resin 10, so that the exposed part of the photosensitive resin is hardened, and non-exposured parts are retained as liquid state. After the hardening proceeds to an appropriate stage, the photosensitive resin 10 is taken out by peeling out the rear seat 9, and by washing the unhardened parts as a development an intended stamp is produced. FIG. 3 shows one example of the stamp made by the above-mentioned process. In the stamp of FIG. 3, together with the line pattern portrait of a person, name of the person is put under the portrait. The attaching of such character can be easily made by reading out the character data which are preliminarily stored in the memory and adding it to the line pattern data, or by optically superposing the read-out and displayed character on the displayed portrait. In the embodiment of FIG. 1, a character generating circuit 4 is connected to the image data memory 3b, and by keying of the intended characters on a key board of the character data generator 4, alphabetical letter or Chinese character, etc. can be combined on the line pattern image. By such keying, data of desired character memorized in the image data memory 3b is read out, and written in a desired part on the image in the data memory 3b. The written information is read out together with the above-mentioned line-pattern processed image data signal and converted into ordinary TV signal, and the line pattern image with the letter or character is displayed by the TV display apparatus 5. Principle of the character data generator 4 is fundamentarily the same as that of the word processor, and detailed elucidation thereof is omitted.

The above-mentioned first embodiment utilizes a photosensitive resin layer as an intermediate measure for fixing the line-pattern-processed image data and the character data. Accordingly, the system has a problem that the system requires to make the intermediate film which is later to be thrown out, and photographing by the camera 7 on the photosensitive film 8 and subsequent developing of the photosensitive film to make the intermediate film is wasteful and time-taking as a whole. In order to eliminate the above-mentioned time-taking and wastful steps, a second example shown in FIG. 7 has been made.

Figure 7:
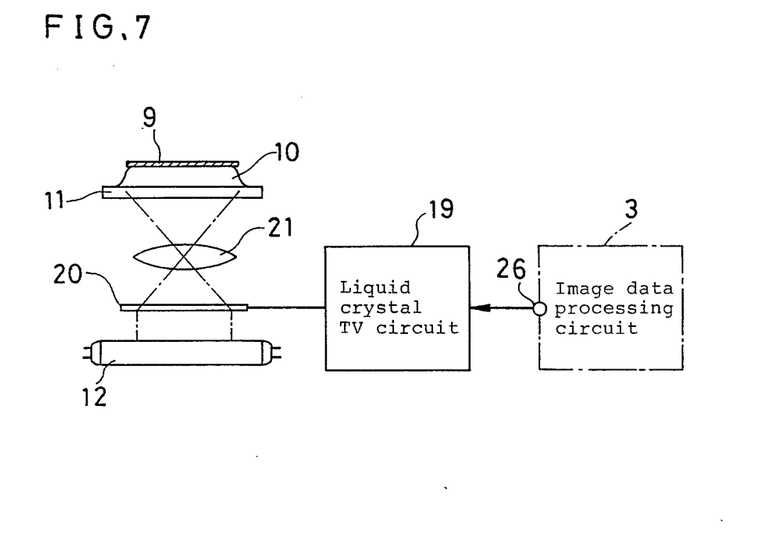
FIG. 7 is a block diagram showing one example of stamp making apparatus utilizing a liquid crystal panel display apparatus in exposing the line pattern on a photosensitive resin layer.

FIG. 7 shows second embodiment wherein no intermediate photosensitive film is used for fixing the line-pattern-processed image information and the letter thereon.

In FIG. 7, on a glass plate 11 a photosensitive resin 10 is coated, and thereon a rear substrate 9 is placed so as to make the thickness of the photosensitive resin layer uniform. As the photoactive light source 12, the similar light source as that of FIG. 2 is used. In this embodiment, instead of the intermediate film 8 of FIG. 2, a liquid crystal display panel 20, which is driven by electric signal from a liquid crystal TV circuit 19, is placed in front of the light source 12. And the image made by the liquid crystal display panel 20 is projected by a projection lens 21 on the photosensitive resin layer 10. The liquid crystal TV circuit 19 receives TV signal from the image data processing circuit 3 which is the same one as described with reference to FIG. 1, through the terminal 26. By means of the liquid crystal display panel 20, a line-pattern portrait 14 as shown in FIG. 4b is produced, and the photoactive rays passing through the liquid crystal display panel as the exposure mask is projected on the photosensitive resin layer 10, being contracted to an appropriate size by the projection lens 21. The liquid crystal display panel and the liquid crystal TV circuit are of known art, and therefore the detailed explanation is not given here. This embodiment can dispense with the developing process of the intermediate photosensitive film, and the photosensitive resin layer is exposed directly by the liquid crystal TV image, and therefore the whole process becomes very simple.

Figure 8:
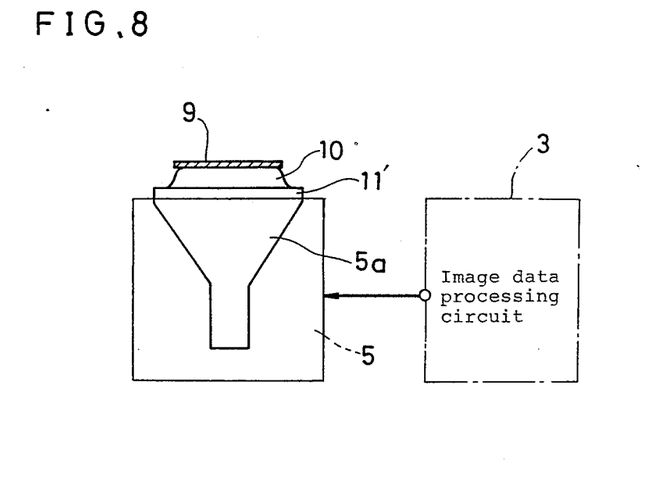
FIG. 8 is a block diagram showing one example of making a stamp by exposing a photosensitive layer by direct using of a cathode ray tube.

Further, a third example is shown in FIG. 8. In this embodiment, a face plate 11' of a cathode ray tube 5a is disposed upward, and a photosensitive resin layer 10 is coated thereon. And further thereon a rear substrate 9 for making the thickness of the photosensitive resin layer uniform is provided. For this embodiment, the CRT is preferably of the type to emit the photoactive rays, such as UV rays, apart from the ordinary TV CRT which is designed not to emit ultraviolet rays. By receiving the TV signal from the image data processing circuit 3, the CRT 5a makes a line pattern picture 14 as shown in FIG. 4(b). The photosensitive resin layer 10 is exposed to the photoactive rays of the line pattern picture directly by the picture displayed on the face plate of the CRT 5a. This embodiment is very simple in configuration by dispensing with the light source 12 and the optical lens 21.

Since there is no optical lens between the displayed picture and the photosensitive resin layer 10, the contracting of the picture is made by the TV circuit in the TV set 5 or in the image data processing circuit 3.

Figure 9:
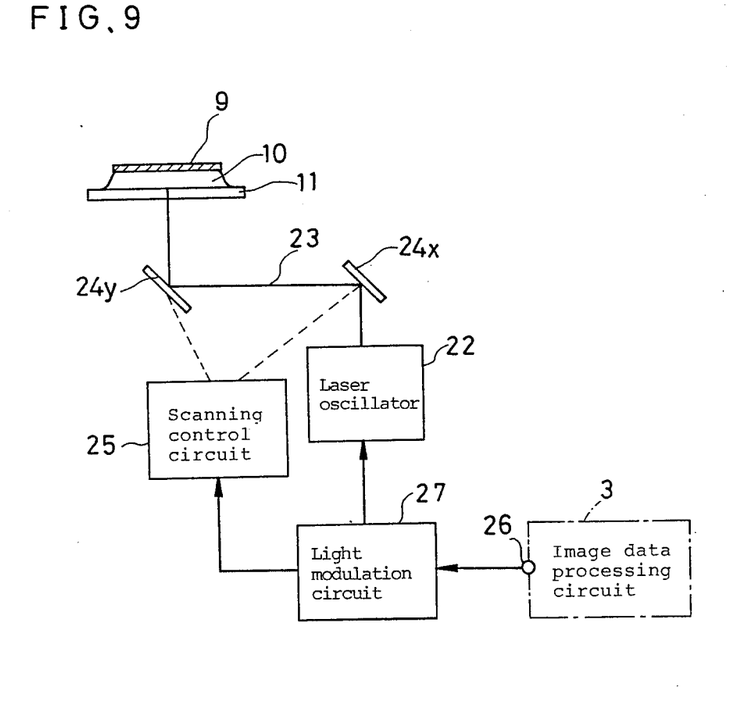
FIG. 9 is a block diagram showing an example of using a laser light scanning system in exposing a photosensitive resin layer.

A fourth embodiment is shown in FIG. 9. This embodiment utilizes a laser light scanning system to make an exposure of the photosensitive resin layer 10 to the line pattern rays. A laser light beam emitted from the on-off modulated laser oscillator 22 is scanned vertically and horizontally by means of horizontal scanning mirror 24x and a vertical scanning mirror 24y which are driven by a scanning control circuit 25. By the vertical and horizontal scanning of the on-off modulated laser beam as above, the laser beam is scanned in two-dimensional way to make an image corresponding to the image data signal given from the image data processing circuit 3. The scanning control circuit 25 controls the mirros 24x and 24y by receiving signal from a light modulation circuit 27 which receives the TV signal from the image data processing circuit 3 and controls on-off of the laser light in the laser oscillator 22. By the above-mentioned configuration the line pattern picture is exposed by the photoactive rays. Accordingly, by developing the exposed photosensitive resin layer 10 on the substrate 9, an intended stamp of the line pattern picture is obtainable.

The above-mentioned various embodiments has own features such as simpleness of configuration or shortcoming such as requiring long exposure time, and therefore, they should be selected corresponding to purposes.

The utility of the apparatus and method in accordance with the present invention is not necessarily limited to the use of making stamps of portrait or picture of face, but may be applicable to any matter which is to be made the stamp. For the photosensitive resin layer, resin of various types may be usable, and they are selected depending on the purposes. As to the kind of the light source, that which emits rays which are suitable for the photosensitive resin layer used. Since the size of the stamp to be produced is determined by the size of the intermediate film 8 and this can be varied by selecting magnifying factor of the camera 7, both the expansion and contraction of the pattern or picture is freely made.

The method and apparatus in accordance with the present invention is further usable not only for the rubber stamp, but also for stamps or types for printing.

As described above, according to the present invention, the line pattern picture of any desired matter can be made without any skill of draftman. Furthermore, since the stamp made in accordance with the present invention has no small dots disposed with very high density, and the graving can be deep enough. Therefore, there is no trouble of filling of groove or engraved parts with dust and ink, and thereby, the stamp is durable to abrasion and is usable for many times.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. Method for making a stamp comprising:
   step of producing image data signal from an object,
   step of processing said image data signal to produce a signal of line pattern of edges of said object,
   step of producing an optical image of photoactive rays from said signal of line pattern,
   step of irradiating a photosensitive resin layer formed on a substrate with said photoactive rays of said optical image, and
   step of developing a latent image made by said irradiation on said photosensitive resin layer to produce a stamp of said line pattern.

2. Method for making a stamp comprising:
   step of producing image data signal from an object,
   step of processing said image data signal to produce a signal of line pattern of edges of said object,
   step of producing an optical image of photoactive rays from said signal of line pattern,
   step of irradiating a photosensitive film with said photoactive rays of said optical image,
   step of developing a latent image made by said irradiation on said photosensitive film to produce a mask pattern,
   step of irradiating a photosensitive resin layer formed on a substrate with a photoactive light through said mask pattern, and
   step of developing a latent image made by said irradiation on said photosensitive resin layer, to produce a stamp of said line pattern.

3. An apparatus for making a stamp comprising:
   means for producing image data signal from an object,
   means for processing said image data signal to produce a signal of line pattern of edges of said object,
   means for producing an optical image of photoactive rays from said signal of line pattern to produce an image of line pattern, and
   means for irradiating a photosensitive resin layer formed on a substrate with said photoactive rays of said optical image.

4. An apparatus for making a stamp in accordance with claim 3, wherein
   said means for producing image data signal contains a character signal generating part,
   whereby data of character signal generated thereby is reproduced in combination with said optical image by said means for producing an optical image.

5. An apparatus for making a stamp in accordance with claim 3, wherein
   said means for producing image data signal includes a television camera to produce said image data signal,
   said means for producing an optical image includes a television display apparatus which receives said image data signal and produces said optical image of line pattern, and
   said means for irradiating a photosensitive resin layer includes means for producing a mask film by irradiating photoactive rays of said optical image of line pattern on a photosensitive film and means to irradiate said photosensitive resin layer with photoactive rays of image of said line pattern, to produce a stamp of said line pattern thereon.

6. An apparatus for making a stamp in accordance with claim 3, wherein
   said means for producing image data signal includes a television camera to produce said image data signal, said means for producing an optical image includes a television display apparatus which receives said image data signal and produces said optical image of line pattern on a liquid crystal display pannel, and said means for irradiating a photosensitive resin layer includes a light source for emitting photoactive rays to be irradiated through said liquid crystal display pannel on said photosensitive layer, to produce a stamp of said pattern thereon.

7. An apparatus for making a stamp in accordance with claim 3, wherein said means for producing an optical image is a TV set which receives TV signal from said means for processing said image data signal and displays TV image on its phospher screen and said means for irradiating a photosensitive resin layer comprises means for holding said photosensitive resin layer on said phosphor screen of said TV set.

8. An apparatus for making a stamp in accordance with claim 3, wherein said means for producing an optical image comprises a laser beam scanning device for scanning a laser beam as said photoactive rays in horizontal and vertical direction, and a laser beam modulation means for on-off controlling of said laser light beam responding to said image data signal.

* * * * *